(12) United States Patent
Allmon

(10) Patent No.: US 6,201,418 B1
(45) Date of Patent: *Mar. 13, 2001

(54) DIFFERENTIAL SENSE AMPLIFIER WITH REDUCED HOLD TIME

(75) Inventor: Randy Lee Allmon, Hopedale, MA (US)

(73) Assignee: Compaq Computer Corporation, Houston, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/132,797

(22) Filed: Aug. 13, 1998

(51) Int. Cl.$^7$ .................................................. G01R 19/00
(52) U.S. Cl. ........................... 327/52; 327/57; 365/189.05
(58) Field of Search .................................. 327/51, 52, 54, 327/55, 63, 65, 67, 57, 90, 91; 365/189.01, 189.05, 189.07, 190, 207

(56) References Cited

U.S. PATENT DOCUMENTS

| | | | |
|---|---|---|---|
| 4,910,713 | 3/1990 | Madden et al. | 365/189 |
| 5,309,047 | * 5/1994 | Tiede et al. | 327/52 |
| 5,377,150 | * 12/1994 | McClure | 365/207 |
| 5,491,667 | * 2/1996 | Sharp | 365/189.04 |
| 5,508,644 | * 4/1996 | Branson et al. | 327/57 |
| 5,526,314 | * 6/1996 | Kumar | 365/207 |
| 5,546,026 | * 8/1996 | Lin et al. | 327/54 |
| 5,648,935 | * 7/1997 | Koh et al. | 365/205 |
| 5,650,971 | * 7/1997 | Longway et al. | 365/207 |

OTHER PUBLICATIONS

Gowan, "Full Custom Design Benefits and Verfication Headaches," slides accompanying presentation at *1997 Design Automation Conference*, Jun. 1997, Anaheim, CA.

Montanaro et al, "A 160–Mhz, 32–b, 0.5–W CMOS RISC Microprocessor," *IEEE Journal of Solid State Circuits*, vol. 31, No. 11, (1996).

Chuang, Ching–Te et al., "SOI for Digital CMOS VLSI: Design Considerations and Advances," Proceedings of the IEEE, 86(4): 689–720 (Apr. 1998).

Glasser, Lance A., and Dobberpuhl Daniel W., "The Design and Analysis of VLSI Circuits," (MA: Addison–Wesley Publishing), pp. 286–289 (1985).

Matson, M. et al., "A 600MHz Superscalar Floating Point Processor," Paper on EV6 Fbox given at European Solid–State Circuits Conference (Sep. 1998).

* cited by examiner

Primary Examiner—Timothy P. Callahan
Assistant Examiner—Hai L. Nguyen
(74) Attorney, Agent, or Firm—Cesari and McKenna, LLP

(57) ABSTRACT

A sense amplifier includes cross-coupled n-transistors that provide, from a predetermined time during one sample period to the start of the next precharge period, a path from a discharging internal node to the low supply voltage VSS. The n-transistors provide a discharge path from the time the internal node falls sufficiently below a precharge voltage to cause the transistors to operate differentially, until the time the node is again precharged, regardless of changes in the state of the input signals. The gate voltages of the cross-coupled transistors are controlled by the internal nodes, and the transistors participate in a positive feedback loop that drives the non-discharging internal node to a high supply voltage VDD through a cross-coupled p-transistor that is controlled by the discharging node. For a sense amplifier that precharges the pre-output nodes low, cross-coupled p-transistors similarly provide a path to VDD to charge the pre-output nodes from a point in one sample period to the start of the next precharge period, regardless of changes in the state of the input signals.

6 Claims, 4 Drawing Sheets

DIFFERENTIAL SENSE AMPLIFIER WITH REDUCED HOLD TIME

FIELD OF INVENTION

The invention relates generally to sense amplifiers and, in particular, to CMOS differential sense amplifiers.

BACKGROUND OF THE INVENTION

A digital sense amplifier may be used as an edge-triggered latch, or flip-flop, that samples and holds a binary input signal. Ideally, the input signal is sampled by the sense amplifier instantaneously at a predetermined point on the rising edge of a clock signal. In practice, however, the sampling occurs over a finite time, and the input signal must be held constant while it is sampled. The time during which the input signal must be held constant before the rising edge of the clock signal is referred to as the "setup time," and the time it must be held constant after the rising edge is referred to as the "hold time."

If the input signal changes during the setup or hold times, the latch may produce output signals that are not at binary levels, that is, high or low signals that are not at supply voltage VDD (high) or VSS (low) levels, and are thus ambiguous. Alternatively, the latch may produce output signals that correspond to the input signal at some point in time other than the desired sample time, and thus, provide incorrect values to receiving circuitry.

The length of the setup and hold times limits the time during which circuitry that processes the input signals may operate. To provide signals to the latch, the processing circuitry can modify the input signals only during the portion of the clock cycle that follows the hold time associated with a previous sample time and precedes the setup time associated with a next sample period. At the next sample time the latched input signals may be sampled by a next latch, and then passed on to a next stage of processing circuitry, and so forth. The hold time imposes timing restrictions on the design that must be met for functionality. It is therefore desirable to minimize hold time on heavily used circuits, such as latches, to avoid signal timing issues that can cause the integrated circuit to fail to operate correctly.

Known prior circuits reduce, for example, hold time while at the same time increasing the setup time. These circuits thus require that the input signals be held stable for essentially the same relatively long period of time. It is therefore desirable to minimize hold time, without causing a corresponding increase in setup time.

SUMMARY OF THE INVENTION

A sense amplifier that operates as a differential input buffer latch includes cross-coupled n-transistors that provide, from a predetermined time during one sample period to the start of the next precharge period, a path from a discharging internal node to the low supply voltage VSS. The n-transistors essentially operate from the time the voltage at an internal node falls sufficiently below a precharge voltage until the time the node is again precharged, regardless of changes in the state of the input signals.

More specifically, each "pre-output" node of the differential sense amplifier is controlled by a p-transistor and an n-transistor that are connected in series. An input stack n-transistor, with its gate tied to an input line, is connected in series to these transistors, to provide a path to VSS for discharging the pre-output node when the associated input signal is high. The cross-coupled n-transistors discussed above are connected essentially to by-pass the input stack transistors, and provide a path to VSS even if the high input signal that drives the input stack n-transistor goes low before the pre-output node is discharged fully to VSS.

The transistors associated with one node are cross-coupled to the transistors associated with the other node, such that they provide positive feedback to drive the output nodes high and low more quickly. The cross-coupled n-transistors participate in the positive feedback, and thus, operate to continue to drive the output nodes fully to the desired VDD and VSS states even after the input signals change state. Accordingly, the input signals need to remain stable only until the cross-coupled n-transistors operate differentially, and need not, as in prior latches, remain stable until the nodes achieve the full VDD and VSS values.

The setup time associated with the sense amplifier is at least the same as the set up time associated with the sense amplifier without the cross-coupled n-transistors and, because of the parallel path to VSS through the cross-coupled n-transistors and, the input stack transistors, may have a slightly shorter setup time.

The invention may be embodied, also, in a sense amplifier that has p-transistors for the stack transistors. In such a sense amplifier the cross-coupled transistors are p-transistors that provide parallel paths to the high supply voltage VDD for charging the pre-output nodes.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
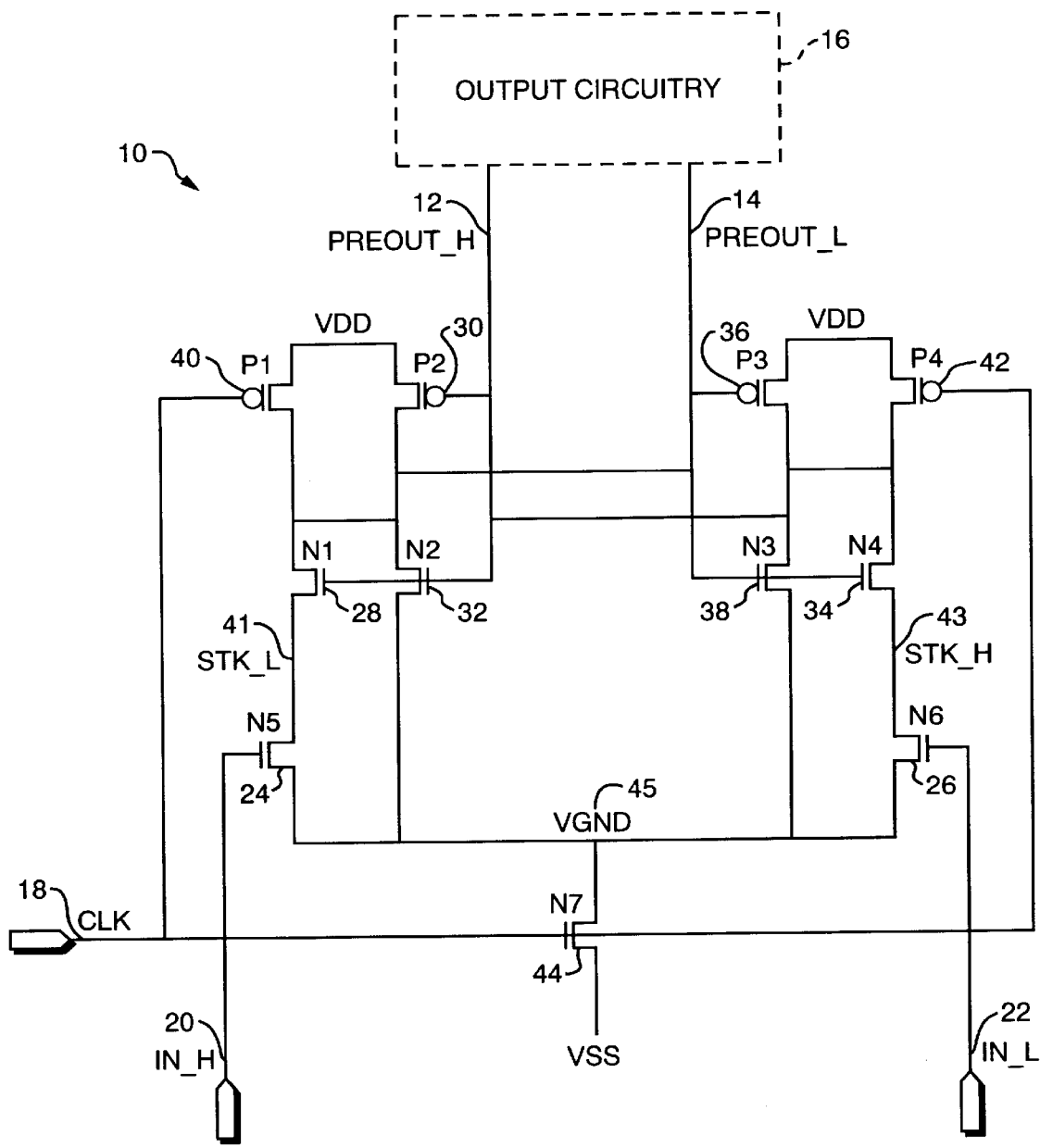
FIG. 1 is a circuit diagram of a sense amplifier constructed in accordance with the invention.

Referring to FIG. 1, a differential sense amplifier 10 controls the voltage levels of "pre-output" nodes 12 and 14. When the voltage levels of these nodes achieve VDD and VSS levels, they are "latched," and captured by the output circuitry 16. First, the operation of the sense amplifier without cross-coupled n-transistors 32 and 38 is discussed. Then, the improved operation of the circuit with these transistors is discussed.

Input signals on lines 20 and 22 are tied to the gates of input stack transistors 24 and 26 that control the voltages of stack nodes 41 and 43. The input signals control the stack transistors when a clock signal on line 18 goes high to start a sample period, and turns on an "evaluate" transistor 44. The pre-output nodes 12 and 14 are controlled during the sample period, respectively, by a p-transistor 30 or 36 and n-transistor 28 or 34 that are connected in series with the input stack transistor 24 or 26. The p-transistors and n-transistors are cross-coupled, to drive the pre-output nodes more quickly high to VDD and low to VSS, as discussed below.

Before the sample period, the clock signal on line 18 is low to signal a precharge period. The low clock signal turns on precharge p-transistors 40 and 42, which pull-up the voltages of the pre-output nodes 12 and 14, the stack nodes 41 and 43 and a "virtual ground" node 45. As the various nodes are driven high, the cross-coupled p-transistors 30 and 36 turn off.

When the clock signal on line 18 rises to signal a next sample period, the precharge p-transistors 40 and 42 turn off and the evaluate transistor 44 turns on, to drive the virtual ground node 45 low to VSS. As the voltage at node 45 falls, the gate-to-source voltages of the input stack transistors 24 and 26 increase.

The increasing gate-to-source voltages on the input stack transistors cause the input stack transistor 24 or 26 with the higher gate voltage, i.e., the transistor that receives the higher of the two input signals, to draw more drain-to-source current than the input stack transistor with the lower input signal. Accordingly, the drain voltage of the transistor with the higher input signal is reduced below the drain voltage of the other input stack transistor, and the voltage at the corresponding stack node 41 or 43 falls below the voltage at the other stack node. Similarly, the voltage also falls at the corresponding pre-output node 12 or 14.

When the voltages at the pre-output nodes 12 and 14 differ, the cross-coupled n-transistors 28 and 34 start to function differentially. The lower voltage at one of the pre-output nodes, for example, node 14, turns off the n-transistor 34, and also turns on the complementary cross-coupled p-transistor 36. As the transistor 36 turns on, it drives up the voltage at the associated pre-output node 12 and stack node 43. As these voltages rise, the cross-coupled n-transistor 28 that has its gate tied to the node 12 is driven harder, pulling the voltage at the pre-output node 14 lower. There is thus positive feedback through the cross-coupling, to more quickly drive the pre-output nodes high and low in accordance with the differential voltages on the input lines 20 and 22. The states of the pre-output nodes 12 and 14 can be latched in output circuitry 16 attached to the pre-output nodes 12 and 14 once they reach their final complementary states of VDD and VSS.

The sense amplifier functions quite well as long as the input signals on line 20 and 22 do not change before the voltages at the pre-output nodes 12 and 14 reach their final states. If, in the example, the signal on line 20 goes low and turns off the n-transistor 24 before the node 14 reaches its final state, the node 14 may be capacitively held constant above VSS until the clock falls to signal a next precharge state. Accordingly, the node will not provide a well-defined binary value to the output circuitry during the sample period.

When the n-transistors 32 and 38 are included in the circuit, the pre-output nodes 12 and 14 will be driven to their final complementary states of VSS and VDD, as long as the differential input signals cause one of the pre-output nodes 12 or 14 to discharge sufficiently that these n-transistors operate differentially. This occurs even if the input signals on line 20 and 22 change before the nodes reach their final states.

In the example, the pre-output node 14 is discharging in response to a high clock signal on line 18 and a high input signal on line 20, and the associated n-transistors 24, 28 and 32 are drawing more drain-to-source current than the n-transistors associated with the pre-output node 12. As the voltage at pre-output node 14 falls, the n-transistors 38 and 34 turn off and the cross-coupled p-transistor 36 turns on, to drive the pre-output node 12 back to VDD. If the signal on line 20 now goes low, the n-transistor 24 turns off and opens the path from the input stack node 41 to VSS. The discharge path through the n-transistor 32 remains, however, and the pre-output node 14 continues to discharge. The decreasing voltage of the pre-output node 14 lowers the gate voltage of the cross-coupled p-transistor 36, and drives the p-transistor harder, to pull the voltage of the pre-output node 12 more quickly up to VDD. As the voltage of pre-output node 12 rises, it raises the gate voltage of the n-transistor 32, and thus, drives the transistor harder to pull down the voltage of the node 14, and so forth. The pre-output node 14 is thus driven fully to VSS through the n-transistor 32, while the node 12 is driven to VDD through the p-transistor 36.

As long as the evaluation transistor 44 remains turned on by the clock signal on line 18, the n-transistor 32 provides the path to VSS for the discharging of the pre-output node 14. If the pre-output node 12 is instead the one that is discharging, the transistor 38 provides the path to VSS.

Without the cross-coupled n-transistors 32 and 38, the input signals on lines 20 and 22 would have to be held stable for a period of time that is sufficient to discharge one of the pre-output nodes 12 or 14 fully to VSS, which through positive feedback drives the other node fully to VDD. With the inclusion of the transistors 32 and 38, however, the same result is achieved by holding the input signals stable only until the pre-output nodes are driven to differential voltages that are sufficient to drive one of the n-transistors 32 or 38 harder than the other.

At the start of the setup time, the cross-coupled n-transistors 32 and 38 provide paths to VSS for the discharging pre-out node that are in parallel with the paths through the input stack transistors 28 and 34. The n-transistors 32 and 38 thus allow the discharging pre-output node to discharge slightly faster than it can in an amplifier that does not have the parallel paths. Accordingly, the setup time for the amplifier 10 is at least the same as if not shorter than the setup time associated with the amplifier that does not have the transistors. The sense amplifier 10, with its reduced hold time has a setup time that at a minimum has not increased, which means that the total required time to hold the input signals stable is reduced with the inclusion of the cross-coupled transistors.

Figure 2:
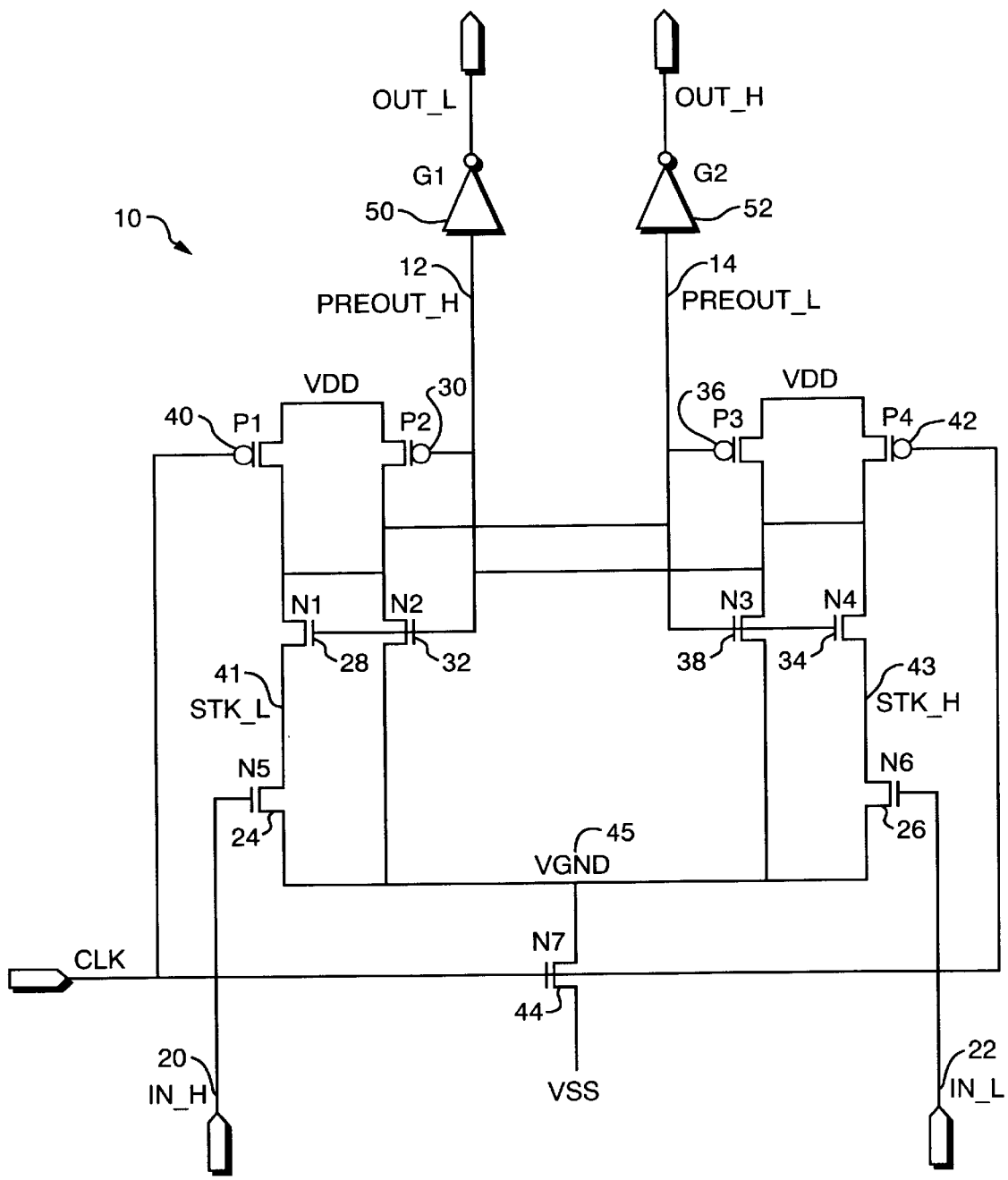
FIG. 2 is a circuit diagram of the sense amplifier of FIG. 1 with inverters as output circuitry.
Figure 3:
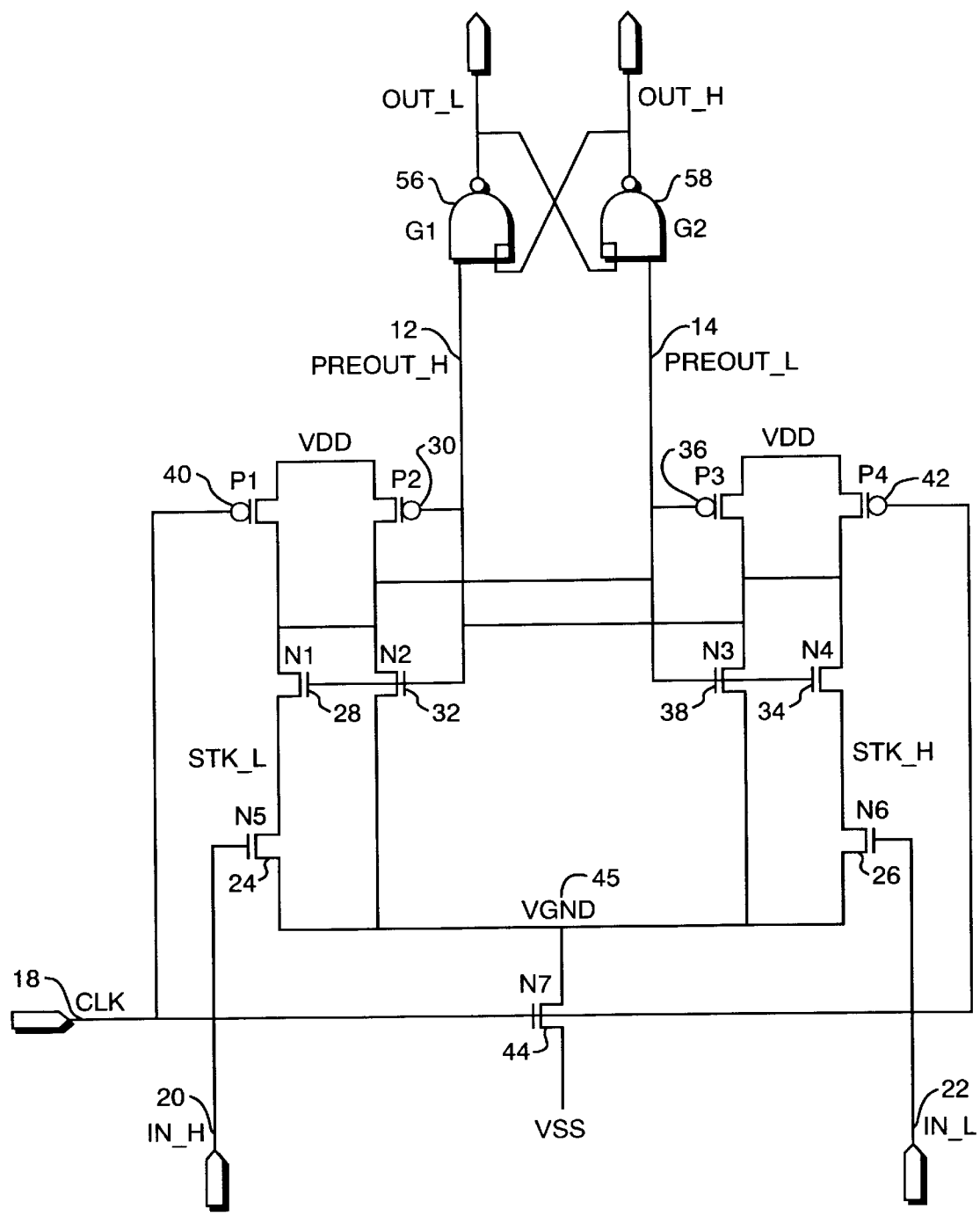
FIG. 3 is a circuit diagram of the sense amplifier of FIG. 1 with NAND gates as output circuitry.

FIG. 2 depicts the differential sense amplifier 10 connected to inverters 50 and 52, which buffer the sense amp pre-output signals for subsequent latching. Preferably, layout of the combined inverters 50 and 52 and the remaining sense amplifier transistors is kept small to minimize parasitic capacitance and resistance of the pre-output nodes thus improving evaluation time and lowering hold time. FIG. 3 depicts the sense amplifier connected to cross-coupled NAND gates 56 and 58 that similarly produce the latch output signals and minimize parasitic capacitance and resistance. As discussed, the inverters and the NAND gates produce binary-valued output signals when the pre-output nodes 12 and 14 achieve their full complementary states of VDD or VSS.

Figure 4:
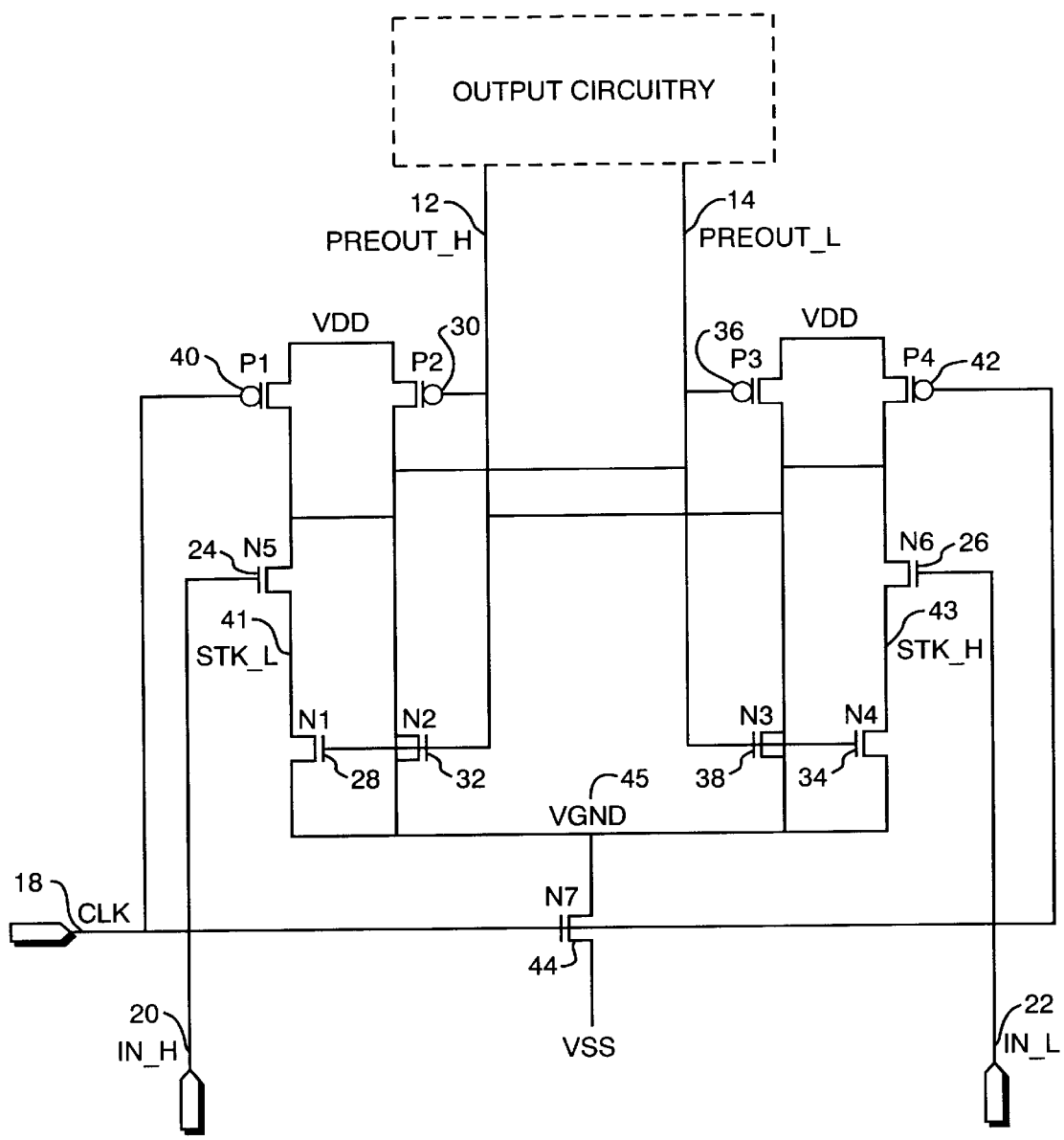
FIG. 4 depicts an alternative configuration of a sense amplifier constructed in accordance with the invention.

The n-transistors 32 and 38 may be included in sense amplifiers with other transistor configurations, to provide paths between pre-output nodes and VSS that are not disrupted when the associated input signals change state. For example, as depicted in FIG. 4, the transistors 32 and 38 may be included in the sense amplifier described in U.S. Pat. No. 4,910,713, which is assigned to a common assignee and is incorporated herein by reference.

The n-transistors 32 and 38, by providing a path to VSS until the clock signal on line 18 falls to start a next precharge period, also allow the latch to function properly at low frequencies, by making it essentially static. Without these transistors, a change in the states of the input signals, even after the hold time, may allow the p-transistors 30 and 40 or 36 and 42 to charge the discharged output node through subthreshold leakage. If this occurs, the binary output value produced at the associated output node may be corrupted.

The inventive latch has the versatility to operate properly in high-speed and low-speed applications. The latch can thus also be used in high-speed systems that include low-frequency stand-by or energy-saving modes.

As is evident to those skilled in the art, the invention may be incorporated into a sense amplifier that uses p-transistors as input stack transistors to drive the pre-output nodes high during the sample time. In such a sense amplifier cross-coupled p-transistors provide a path to VDD from a predetermined point in the sample period until the start of the next precharge period.

The foregoing description has been limited to a specific embodiment of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A differential sense amplifier including:
   A. two input stack transistors that control, respectively, voltages of two input stack nodes based on states of two input signals;
   B. two sets of cross-coupled complementary transistors connected, respectively, in series with the input stack transistors, the cross-coupled complementary transistors controlling voltages of two pre-output nodes based in part on differential voltages of the two stack input nodes; and
   C. cross-coupled transistors that are controlled by differential voltages of the pre-output nodes; and
   D. an evaluate transistor in which the cross-coupled transistors are connected to provide a path to the evaluate transistor that is turned off to provide a virtual ground during a precharge period, and wherein, during a start of a sample period, the evaluate transistor is turned on to connect the cross-coupled transistors to a low supply voltage VSS for a discharging pre-output node, the cross-coupled transistors operating in a positive feedback loop that includes the cross-coupled complementary transistors to drive the discharging pre-output node to VSS and the other pre-output node to a high supply voltage VDD even when the status of the two input signals change during a hold time.

2. The differential sense amplifier of claim 1, wherein the cross-coupled transistors are n-transistors that are associated, respectively, with each of the pre-output nodes.

3. The differential sense amplifier of claim 2 wherein each of the n-transistors has a gate voltage that is controlled by the voltage at the other pre-output node.

4. The differential sense amplifier of claim 2, wherein the input stack transistors are n-transistors with gates tied to the input signals.

5. The differential sense amplifier of claim 1, wherein each set of the cross-coupled complementary transistors have gate voltages controlled by the voltage at the other pre-output node.

6. The differential sense amplifier of claim 1 further including at each pre-output node a precharge transistor that operates during the precharge period to drive the pre-output node to a predetermined state.

* * * * *